United States Patent [19]

Oliva

[11] Patent Number: 5,784,021
[45] Date of Patent: Jul. 21, 1998

[54] NOISELESS RADAR DETECTOR

[75] Inventor: David C. Oliva, Chicago, Ill.

[73] Assignee: Cobra Electronics Corporation, Chicago, Ill.

[21] Appl. No.: 591,706

[22] Filed: Jan. 25, 1996

[51] Int. Cl.[6] .................................................. G01S 7/40
[52] U.S. Cl. .................................... 342/20; 342/175
[58] Field of Search ................................... 342/20, 175

[56] References Cited

U.S. PATENT DOCUMENTS

| | | | |
|---|---|---|---|
| 3,737,802 | 6/1973 | Kawakami | 331/96 |
| 3,831,110 | 8/1974 | Eastman | 331/107 G |
| 4,034,313 | 7/1977 | Jones et al. | 331/96 |
| 4,255,730 | 3/1981 | Sekine et al. | 333/247 |
| 4,319,244 | 3/1982 | Hirota et al. | 342/104 |
| 4,342,010 | 7/1982 | Dixon, Jr. et al. | 333/17.2 |
| 4,443,796 | 4/1984 | Muller | 342/28 |
| 4,462,007 | 7/1984 | Shirai | 331/96 |
| 4,553,265 | 11/1985 | Clifton et al. | 455/325 |
| 4,649,354 | 3/1987 | Khanna | 331/99 |
| 4,658,440 | 4/1987 | Pavio et al. | 455/324 |
| 4,727,338 | 2/1988 | Mamodaly et al. | 331/96 |
| 4,731,611 | 3/1988 | Müller et al. | 342/28 |
| 4,736,454 | 4/1988 | Hirsch | 455/129 |
| 4,835,498 | 5/1989 | Rouger et al. | 333/205 |
| 4,871,983 | 10/1989 | Graycar | 331/96 |
| 4,952,936 | 8/1990 | Martinson | 342/20 |
| 4,961,074 | 10/1990 | Martinson | 342/20 |
| 5,159,704 | 10/1992 | Pirolli et al. | 455/62 |
| 5,198,786 | 3/1993 | Russell et al. | 333/26 |
| 5,233,319 | 8/1993 | Mizan et al. | 333/219.1 |
| 5,341,138 | 8/1994 | Ono et al. | 342/20 |
| 5,363,105 | 11/1994 | Ono et al. | 342/20 |
| 5,365,235 | 11/1994 | Kennedy et al. | 342/44 |
| 5,519,359 | 5/1996 | Driscoll | 331/39 |
| 5,563,617 | 10/1996 | Redfern et al. | 343/767 |

OTHER PUBLICATIONS

"Design Considerations and Applications," by Trans–Tech, Inc.

*Primary Examiner*—John B. Sotomayor
*Attorney, Agent, or Firm*—Wallenstein & Wagner, Ltd.

[57] ABSTRACT

A noiseless radar detector with a dielectric resonator to suppress stray electromagnetic radiation generated by a local oscillator within the radar detector is disclosed. The dielectric resonator acts as an RF microwave absorber/attenuator if the resonant frequency of the dielectric resonator corresponds to the frequency of the interference from the local oscillator.

12 Claims, 1 Drawing Sheet

5,784,021

NOISELESS RADAR DETECTOR

DESCRIPTION

TECHNICAL FIELD

The present invention relates to a noiseless radar detector with a dielectric resonator to suppress unwanted interference due to stray electromagnetic radiation generated by a local oscillator within the radar detector.

BACKGROUND OF THE INVENTION

Conventional microwave detectors, such as ones which detect microwave signals transmitted from radar-type speed measurement equipment, for example police radar signals, employ a mixing diode to mix the microwave signal with the output of a local oscillator to demodulate the microwave signal. The local oscillator, however, also generates a signal which causes unwanted interference and may also be detected by certain types of receivers.

SUMMARY OF THE INVENTION

The present invention implements a dielectric resonator into a conventional radar detector to suppress stray electromagnetic radiation generated by the local oscillator within the radar detector. The dielectric resonator acts as an RF microwave absorber/attenuator if the resonant frequency of the dielectric resonator corresponds to the frequency of the interference from the local oscillator. The dielectric resonator may be in the form of a pill, and may be placed within the horn antenna of the radar detector.

DETAILED DESCRIPTION OF THE PREFERRED EMBODIMENT

While this invention is susceptible of embodiments in many different forms, there will herein be described in detail preferred embodiments of the invention with the understanding that the present disclosure is to be considered as exemplifications of the principles of the invention and is not intended to limit the broad aspects of the invention of the embodiments illustrated.

Figure 1:
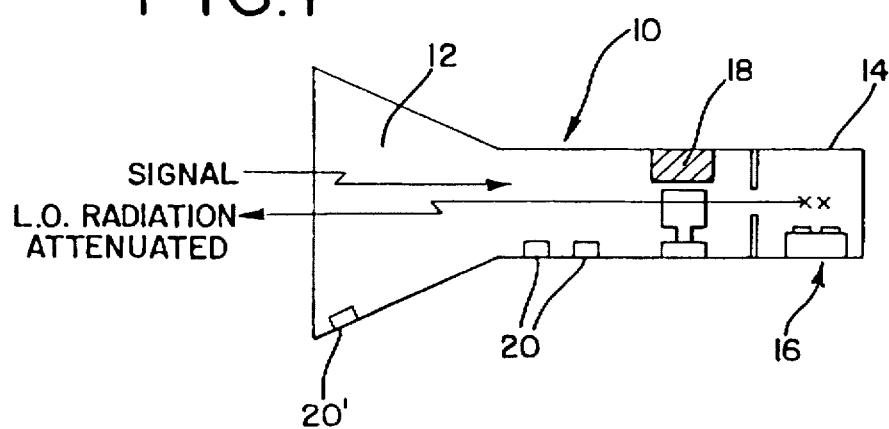
FIG. 1 is a cross-sectional view of a noiseless radar detector in accordance with the present invention.

FIG. 1 is a cross-sectional view of a typical radar detector, generally designated 10, in accordance with the present invention. The radar detector 10 includes a horn antenna 12 which is coupled to the base 14 of the radar detector 10. A local oscillator 16 and a mixer diode 18 are placed within the base 14 of the radar detector 10. Dielectric resonators 20, in the form of small ceramic pills, are positioned within the base 14 toward the center of the radar detector 10 with the horn antenna 12 on one side, and the local oscillator 16 and the mixer diode 18 on the other side. In the alternative, dielectric resonator pills 20' are placed within the horn antenna 12. The resonant frequency of the dielectric resonators 20 corresponds to the frequency of the interference generated by the local oscillator 16.

Figure 2:
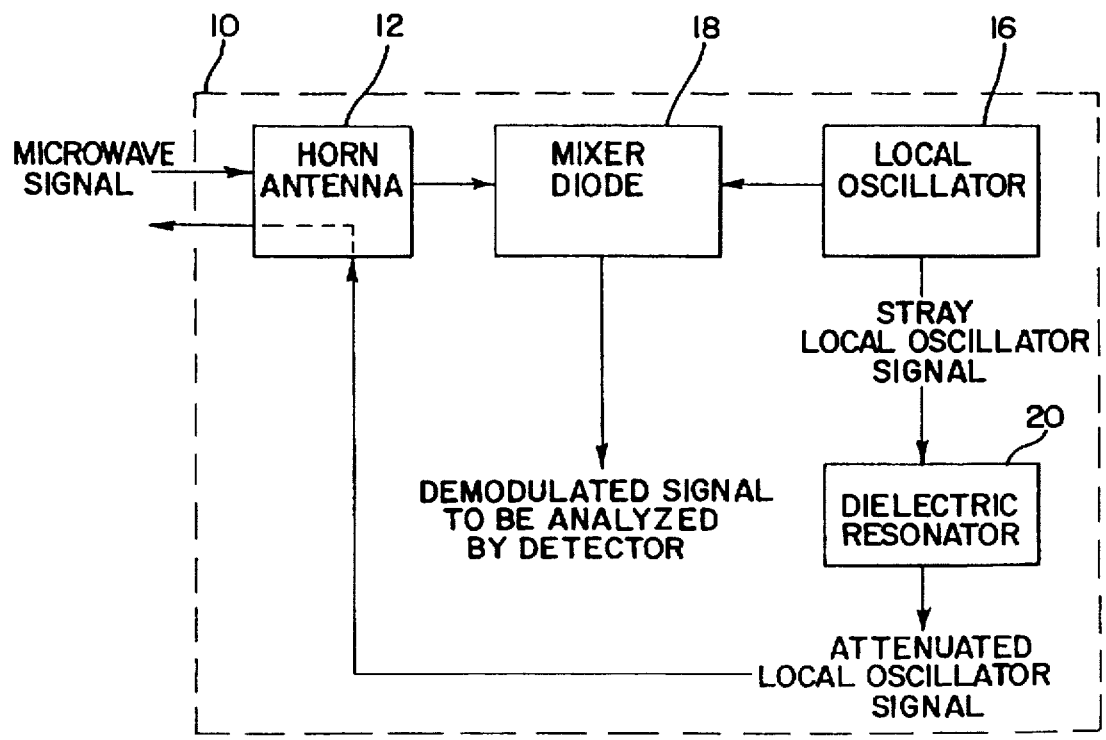
FIG. 2 is a block diagram illustrating the system of FIG. 1.

An illustration of the radar detector system is shown in FIG. 2. The horn antenna 12, which is generally employed as a reception antenna, is tuned to the specific frequency band of the signals being detected. Conventional radar-type speed measuring equipment employ a variety of microwave frequency bands, e.g., 10 GHz band (X band), 24 GHz band (K band) and 35 GHz band (Ka band). When a microwave signal is received by the horn antenna 12, the mixer diode 18 demodulates the signal by mixing it with a signal corresponding to the carrier frequency of the microwave signal. The local oscillator 16 provides the carrier frequency signal to the mixer diode 18. The demodulated signal is then further analyzed by the detector 10 to determine if the appropriate signal is being received.

In addition to providing the carrier signal to the mixer diode 18, the local oscillator 16 also generates a signal which causes unwanted interference and may be detected by certain types of receivers. The dielectric resonators 20 act as RF microwave absorbers/attenuators if the resonant frequency of the dielectric resonators 20 corresponds to the frequency of interference generated by the local oscillator 16. Thus the dielectric resonators 20 may suppress the stray electromagnetic radiation generated by the local oscillator 16. Additionally, dielectric resonators 20 with different absorption frequencies may be used to either create various frequency band pass filters, or to suppress two or more unwanted frequencies within the radar detector 10.

The dielectric resonators 20 may be mounted onto the radar detector by adhesive or by a screw mounting method. An example of appropriate ceramic pill-type dielectric resonators are those manufactured and sold by Trans-Tech.

It will be understood that the invention may be embodied in other specific forms without departing from the spirit or central characteristics thereof. The present embodiments, therefore, are to be considered in all respects as illustrative and not restrictive, and the invention is not to be limited to the details given herein.

What I claim is:

1. A radar detector, comprising:

receiving means for receiving a modulated microwave signal;

demodulating means for demodulating a desired mixing carrier wave from the microwave signal, wherein said demodulating means comprises:

a local oscillator oscillating at a frequency corresponding to the carrier wave; and a mixing diode to subtract or add the carrier wave from or to the microwave signal; and a dielectric resonator detached from said demodulating means having a resonant frequency corresponding to the carrier wave to suppress the carrier wave after the carrier wave is demodulated from the microwave signal.

2. A radar detector as claimed in claim 1, wherein said receiving antenna is a horn antenna.

3. A radar detector as claimed in claim 2, wherein said dielectric resonator is placed within said horn antenna.

4. A radar detector as claimed in claim 1, wherein said dielectric resonator comprises a small ceramic pill.

5. A radar detector as claimed in claim 1, wherein said dielectric resonator is placed between said demodulating means and said receiving means.

6. A radar detector, comprising:

receiving means for receiving a modulated microwave signal;

demodulating means for demodulating a desired mixing carrier wave from the microwave signal, wherein said demodulating means comprises:

a local oscillator oscillating at a frequency corresponding to the carrier wave, wherein said local oscillator generates an interference signal; and a mixing diode to subtract or add the carrier wave from or to the microwave signal; and a first dielectric resonator detached from said demodulating means having a resonant frequency corresponding to the interference signal to suppress the interference signal.

7. A radar detector as claimed in claim 6, wherein said first dielectric resonator comprises a small ceramic pill.

8. A radar detector as claimed in claim 6, further comprising:

a second dielectric resonator detached from said demodulating means having a resonant frequency corresponding to the carrier wave to suppress the carrier wave after the carrier wave is demodulated from the microwave signal.

9. A radar detector as claimed in claim 8, wherein said second dielectric resonator is in the form of a small ceramic pill.

10. A radar detector as claimed in claim 8, wherein said receiving antenna is a horn antenna.

11. A radar detector as claimed in claim 9, wherein said first dielectric resonator and said second dielectric resonator are placed within said horn antenna.

12. A radar detector as claimed in claim 8, wherein said first dielectric resonator and said second dielectric resonator are placed between said demodulating means and said receiving means.

* * * * *